(12) United States Patent
Tan et al.

(10) Patent No.: US 6,277,254 B1
(45) Date of Patent: Aug. 21, 2001

(54) CERAMIC COMPOSITIONS, PHYSICAL VAPOR DEPOSITION TARGETS AND METHODS OF FORMING CERAMIC COMPOSITIONS

(75) Inventors: Qi Tan, Veradale; Jianxing Li, Spokane, both of WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/465,554

(22) Filed: Dec. 16, 1999

(51) Int. Cl.[7] .................................................. C23C 14/00

(52) U.S. Cl. ............................. 204/298.13; 204/298.12; 428/697

(58) Field of Search .................... 204/298.12, 298.13, 204/192.18; 428/697; 148/320, 421, 441; 420/84, 125, 126, 417, 423

(56) References Cited

U.S. PATENT DOCUMENTS

| | | | |
|---|---|---|---|
| 4,027,209 | 5/1977 | Maher | 361/361 |
| 4,135,224 | 1/1979 | Maher | 361/321 |
| 4,222,885 | 9/1980 | Hennings et al. | 252/63.2 |
| 4,244,830 | 1/1981 | Hennings et al. | 106/39.5 |
| 4,324,750 | 4/1982 | Maher | 264/61 |
| 5,320,729 | * 6/1994 | Narizuka et al. | 204/192.13 |
| 5,433,917 | 7/1995 | Srivastava et al. | 419/22 |
| 5,572,052 | * 11/1996 | Kashihara et al. | 257/295 |

FOREIGN PATENT DOCUMENTS

| | | | |
|---|---|---|---|
| 8-73267 | 3/1996 | (JP) | C04B/35/49 |

OTHER PUBLICATIONS

"Modified PZT ceramics for electronic application", P. Roy Chowdhury; Indian J. Phys. 67A (3); pp. 207–236 (1993).

Low–Temperature Densification of Lead Zirconate–Titanate with Vanadium Pentoxide Additive; By Dale E. Wittmer & Relva C. Buchanan; Journal of the American Ceramic Society; vol. 64, No. 8.

(List continued on next page.)

Primary Examiner—Nam Nguyen
Assistant Examiner—Steven H. VerSteeg
(74) Attorney, Agent, or Firm—Wells, St. John, Roberts, Gregory & Matkin, P.S.

(57) ABSTRACT

The invention includes a method for forming a ceramic composition. Materials comprising lead, zirconium, titanium and bismuth are combined together to form a mixture. At least one of the materials is provided in the mixture as a nanophase powder. The mixture is then densified to form the ceramic composition. The invention also includes a method for forming a dense ferroelectric ceramic composition. Lead, zirconium, titanium and bismuth are combined together to form a mixture. The mixture is then densified to form a ferroelectric ceramic composition having a density of greater than or equal to 95% of a theoretical maximum density for the composition. A predominate portion of the composition has a grain size of less than or equal to about 500 nanometers. The invention also includes a ferroelectric ceramic composition comprising lead, zirconium, titanium and bismuth. Such composition has a density of greater than or equal to 95% of a theoretical maximum density for the composition, and a predominate portion of the composition has a grain size of less than or equal to about 500 nanometers.

7 Claims, 1 Drawing Sheet

OTHER PUBLICATIONS

Electromechanical Properties of Lead Titanate Zirconate Ceramics with Lead Partially Replaced by Calcium or Strontium; By Frank Kulcsar; Journal of the American Ceramic Society; vol. 42, No. 1.

Electrical Resistivity of Lead Zirconate Titanate Ceramics Containing Impurities; By Masao Takahashi; Japanese Journal of Applied Physics; vol. 10, No. 5, May, 1971.

Improvement of the PTCR Effect in $Ba_{1x}SR_xTIO_3$ Semiconducting Ceramics by Doping of $Bi_2o_3$ Vapor during Sintering By Jianquan Qi, Wanping Chen, Yajing Wu, and Longtu Li; Communications of the American Ceramic Society, vol. 81, No. 2.

Addition of CA and SR in PLZT to Improve Fram® Performance and Reliability; By T.D. Hadnagy and Tom Davenport; Integrated Ferroelectrics, 1998, vol. 22, pp. 183–193.

* cited by examiner

CERAMIC COMPOSITIONS, PHYSICAL VAPOR DEPOSITION TARGETS AND METHODS OF FORMING CERAMIC COMPOSITIONS

TECHNICAL FIELD

The invention pertains to methods of forming ceramic compositions and ferroelectric ceramic compositions. The invention also pertains to particular ceramic compositions and ferroelectric ceramic compositions, and to physical vapor deposition targets.

BACKGROUND OF THE INVENTION

Ceramic compositions comprising lead, zirconate, and titanate (i.e, so-called PZT compositions) have numerous uses in electrical devices. For instance, ferroelectric ceramic compositions comprising PZT can be used as piezoelectric transducers, electroactuators, capacitors, and electro-optic devices. Additionally, ferroelectric PZT materials can be used as thin film deposition targets in forming portions of non-volatile ferroelectric random access memories (FeRAMs), pyroelectric devices and micro-electromechanical systems (MEMS) by physical vapor deposition.

PZT can be modified for particular applications. For instance, lanthanum modified PZT (referred to as PLZT) is reported to have exceptional properties for utilization in FeRAMs.

PZT ceramics have a number of advantages for utilization in electrical devices. For instance, PZT ceramics can have a high electromechanical coupling coefficient, which can render them particularly useful as piezoelectric transducers. Additionally, PZT ceramics can have a high pyroelectric coefficient, which can make them particularly suitable as infrared detectors. Further, PZT materials can have a high dielectric constant, which can render them particularly useful as dielectric materials in capacitor constructions. Also, PZT ceramics can have superior electrooptic properties, which can render them suitable as electro-optic switches.

A difficulty in utilizing PZT ceramics is in fabrication of suitable PZT materials. Specifically, a number of the PZT applications described above utilize relatively large-dimension PZT ceramics. It can be difficult to control processing conditions to insure high density and good reproducibility throughout a large PZT ceramic. An exemplary application wherein a relatively large PZT ceramic is utilized is physical vapor deposition. Specifically, a PZT ceramic can be utilized as a sputtering target for physical vapor deposition during formation of small-scale circuits, such as, for example, FeRAMs. It is desired that the target be comprised of homogeneous grains having dimensions of 1 micrometer or less (with smaller grain sizes being more desirable than larger grain sizes), have a density approaching maximum theoretical density, and be a single phase perovskite structure. Homogeneity and fine grain size of the target are desired in order that the target can be utilized to deposit films with appropriate chemical composition, uniformity, and preferred orientation at a rapid deposition rate.

A conventional method of forming PZT materials is to densify a mixture comprising lead, zirconium, and titanium. The lead, zirconium and titanium can be in the form of, for example, $PbZrO_3$, $PbTiO_3$, and/or $Pb(Zr, Ti)O_3$. One method of densifying such mixture is through sintering, another method is through hot-pressing, and yet another is through sinter-forging.

A typical sintering method is pressureless (i.e., occurs at atmospheric pressure, and for purposes of interpreting the claims, sintering is to be assumed to be pressureless unless stated otherwise), and is as follows. First, a mixture comprising lead, zirconium and titanium is cold-pressed into a so-called green compact. The mixture can further comprise a binder, such as, for example, polyvinyl acetate. The term "cold-pressing" refers to pressing occurring at or below about 30° C., and typically at a pressure of about 10,000 pounds/in². Once formed, the cold-pressed pellet is subjected to a temperature of at least 1100° C., and typically from 1200° C. to 1400° C., to sinter the pellet. The high temperatures of the sintering process utilize a large amount of heat energy. Such heat energy can deteriorate and erode the interior of a sintering furnace. Accordingly, maintenance costs of sintering furnaces can become expensive. Further, the high temperatures utilized for the sintering process can result in the relatively volatile material PbO being released from the ceramic. The release of PbO removes lead. The loss of lead can alter a composition of the ceramic, and can complicate reproduction of PZT ceramics in sequential sintering processes.

A method which has been utilized to compensate for the loss of lead is to add additional lead to a PZT composition prior to sintering. However, the additional lead can cause its own problems in the form of inhomogeneous lead distribution, and difficulty in controlling lead concentration and lead-site vacancies within a PZT ceramic formed from a material comprising excess lead.

As mentioned above, hot-pressing can be utilized instead of sintering for densifying a PZT. Hot-pressing typically comprises placing a mixture of lead, zirconium, and titanium in a press and compressing the mixture to a pressure of less than 10,000 pounds/in² and typically less than 6,000 pounds/in². During the pressing, a temperature of the material is typically maintained at more than 700° C. An advantage of utilizing hot-pressing instead of sintering can be that hot-pressing frequently is done at lower temperatures than sintering. The lower temperatures of hot-pressing can avoid some of the above-discussed problems associated with sintering. However, a difficulty with hot-pressing is that relatively large equipment is used to press even a small amount of ceramic material. The expenses associated with forming large-scale hot-pressing facilities for pressing large amounts of PZT materials reduces the economic feasibility of hot-pressing processes. Further, the throughput in production of large-scale PZT ceramic materials using hot-pressing is lower than can be accomplished with sintering. Accordingly, sintering can be more attractive than hot-pressing for commercial-scale PZT production.

The last of the above-identified methods of densifying PZT materials, sinter-forging, involves subjecting a green compact (a green compact is referred to above in describing the sinter process) to hot-pressing. Sinter-forging methods can be difficult to commercialize for reasons similar to those discussed above regarding hot-pressing methods.

Because of the commercialization potential of sintering processes, several methods have been utilized in an attempt to improve sintering processes. Among such methods is the addition of sintering aids, such as, for example, metal oxides and fluoride compounds to PZT ceramic compositions. Such additions can reduce sintering temperatures, and thus lower manufacturing costs, while enabling reasonable control of the lead content in resulting PZT ceramics. In particular applications, utilization of additives has been shown to reduce sintering temperatures down to 950° C. for PZT compositions which contain lower valence substituents (e.g., Fe, Mn). However, additives have not been found which can successfully reduce a sintering temperature below 1050° C.

for bulk PZT compositions comprising lanthanum. Further, no process (either sintering, or hot-pressing) has produced a PZT material with a density greater than or equal to 95% of a theoretical maximum density of the material (about 7.9 gm/cm$^3$) while keeping a predominate grain size within the PZT material to less than 500 nanometers. It would be desirable to develop dense PZT materials with small grain sizes for many applications, including, for example, physical vapor deposition target applications.

SUMMARY OF THE INVENTION

In one aspect, the invention includes a method for forming a ceramic composition. Materials comprising lead, zirconium, titanium and bismuth are combined together to form a mixture. At least one of the materials is provided in the mixture as a nanophase powder. The mixture is then densified to form the ceramic composition.

In another aspect, the invention encompasses a method for forming a dense ferroelectric ceramic composition. Lead, zirconium, titanium and bismuth are combined together to form a mixture. The mixture is then densified to form a ferroelectric ceramic composition having a density of greater than or equal to 95% of a theoretical maximum density of the composition. A predominate portion of the composition has a grain size of less than or equal to about 500 nanometers.

In yet another aspect, the invention encompasses a method for forming a ceramic composition. Materials comprising lead, zirconium, titanium and antimony are combined together to form a mixture, with at least one of the materials being provided in the mixture as a nanophase powder. The mixture is then densified to form the ceramic composition.

In yet another aspect, the invention encompasses a ferroelectric ceramic composition comprising lead, zirconium, titanium and bismuth. Such composition has a density of greater than or equal to 95% of a theoretical maximum density for the composition, and a predominate portion of the composition has a grain size of less than or equal to about 500 nanometers.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
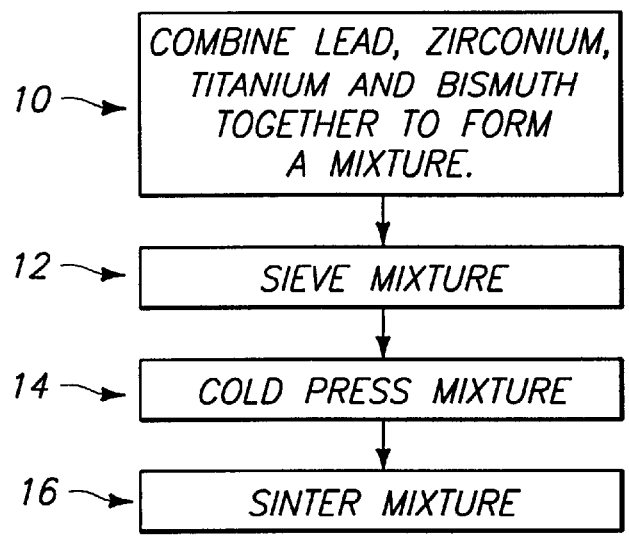
FIG. 1 is a flow chart description of a method encompassed by the present invention.

One aspect of the invention is a method of forming a ferroelectric ceramic composition in accordance with a process outlined in the flow diagram of FIG. 1. At initial step 10 of such flow diagram, lead, zirconium, titanium and bismuth are combined together to form a mixture. The lead, zirconium and titanium can be in the form of $PbZrO_3$, $PbTiO_3$ and/or $Pb(Ti,Zr)O_3$, and the bismuth can be in the form of bismuth oxide ($Bi_2O_3$). If $PbZrO_3$ and $PbTiO_3$ are utilized, such can be combined in the ratio (1−x)$PbZrO_3$: (x)$PbTiO_3$, wherein x is from 0.1 to 0.9. The bismuth oxide preferably comprises from about 0.1 to about 10 weight percent of the mixture, and more preferably comprises from about 0.5 to about 3 weight percent of the mixture. Additional materials, such as, for example, lanthanum, can be included in the mixture. Further, materials can be included which substitute for lead at some of the sites within PZT. For instance, a cationic form of at least one element selected from the group consisting of potassium, sodium, cesium, calcium, strontium, barium, yttrium or lanthanide elements can be included in the mixture. Also, elements can be included which substitute for some of the zirconium or titanium at sites within the PZT. For instance, a cationic form of iron, chromium, hafnium, tin, manganese, niobium, tantalum or tungsten can be included in the mixture. Further, one or both of antimony oxide and vanadium oxide can be included in the mixture. In alternative embodiments of the invention, the mixture can consist essentially of lead, zirconium, titanium, bismuth and oxygen. In yet other alternative embodiments of the invention, the mixture can consist essentially of lead, zirconium, titanium, bismuth, lanthanum and oxygen.

It is preferred that at least some of the materials in the mixture are provided in the form of nanophase powders, with the term "nanophase powder" referring to a material having a predominate portion thereof with a maximum particle size of less than or equal to 500 nanometers, and preferably less than or equal to 100 nanometers. Although only a predominate portion (i.e., greater than 50%) having a particle maximum size of less than 500 nanometers is enough for the powder to fit within the above definition of a "nanophase powder", the powder can consist essentially of particles having a maximum dimension of less than or equal to 500 nanometers, and can further consist essentially of particles having a maximum dimension of less than or equal to 100 nanometers. It is noted that some agglomeration of particles can occur to form agglomerates having maximum dimensions larger than 500 nanometers. As long as the agglomerated particles remain distinguishable from one another and have maximum sizes of less than 500 nanometers, the agglomerated particles are still nanophase particles.

Step 10 of FIG. 1 can be accomplished by, for example, mixing the above-described components in a wet carrier such as, for example, isopropyl alcohol. In a particular embodiment, the components are mixed in isopropyl alcohol by magnetic stirring for about five hours.

The mixed components are in the form of a wet mixture. Such mixture is passed through a sieve (step 12 of FIG. 1) to break apart agglomerated particles, and dried at about 80° C. The sieve can have a mesh size of, for example, from about 100 mesh to about 200 mesh. The dried material is cold-pressed (step 14 of FIG. 1) to form a so-called "green compact". The green compact is sintered (step 16 of FIG. 1).

An advantage of utilizing nanophase powders and bismuth in the step labeled "10" of FIG. 1, is that such combination can lower a pressureless sintering temperature (i.e., a sintering temperature at atmospheric pressure) relative to compositions which lack the nanophase powders and bismuth, and can enable higher density materials to be formed than can be formed without the nanophase powders and bismuth. For instance, sintering of PZT comprising one weight percent bismuth oxide at 900° C. for a time of about 6 hours leads to a ceramic material comprising 100% of the theoretical density for such material (about 7.9 gm/cm$^3$), and sintering of PLZT comprising one weight percent bismuth oxide at 900° C. for a time of about 6 hours leads to a ceramic material having 100% of the maximum theoretical density for such material (about 7.9 gm/cm$^3$, with the actual density being determined using, for example, the Archimedes method). Additionally, even lower sintering temperatures can be used and appreciable densities achieved. For instance, sintering temperatures can be lowered to 850° C., and after 15 hours at such temperatures PZT comprising one weight percent bismuth oxide achieves 99% of the theoretical maximum density, while PLZT containing one weight percent bismuth oxide achieves 98% of the theoretical maximum density.

The high densities achieved with sintering of the above-described compositions are substantially higher than densities achieved with conventional compositions. Further, grain sizes of high density compositions of the present invention can remain small. Specifically, a predominate portion of a composition of the present invention can have a maximum grain size of from about 100 nanometers to about 5 microns, and frequently a predominate portion of the composition will have a maximum grain size of less than about 500 nanometers. In particular compositions, a predominate portion will have a grain size of less than 200 nanometers, less than 150 nanometers, or less than 100 nanometers. In other compositions, a maximum grain size of the entirety of the composition will be less than or equal to about 500 nanometers; in yet other compositions, a maximum grain size of the entirety of the composition will be less than or equal to about 200 nanometers; in yet other compositions, a maximum grain size of the entirety of the composition will be less than or equal to about 150 nanometers; and in yet other compositions, a maximum grain size of the entirety of the composition will be less than or equal to about 100 nanometers.

High density compositions of the present invention can also be achieved at sintering temperatures less than or equal to about 800° C. For instance, PZT comprising one weight percent bismuth oxide, and PLZT comprising one weight percent bismuth oxide were found to achieve densities of 98% and 95%, respectively, when sintered at 800° C. for 24 hours.

The effect of bismuth oxide concentration in various PZT mixtures can determine an optimum bismuth oxide concentration for forming ceramic compositions. It is found that samples comprising at least 0.3 weight percent bismuth oxide show a significant decrease in sintering temperature relative to samples comprising less bismuth oxide. Further, it is found that samples comprising more than three weight percent bismuth oxide show less decrease in sintering temperature as compared to samples containing 1 weight percent bismuth oxide. Also, it is found that in samples in which 10 weight percent bismuth oxide is utilized, a density of only 93% is reached at a sintering temperature of 1150° C.

Bismuth oxide can have some effect on properties of PZT other than density and grain size. For instance, electrical resistivity is found to increase with higher bismuth concentrations in PZT materials. However, the materials remain ferroelectric when bismuth is included, as determined by polarization hysteresis of PZT materials comprising bismuth therein. Remnant polarization appears to be dependent on bismuth oxide content, as well as on a sintering condition utilized to form a ceramic material. High amounts of bismuth oxide appear to reduce polarization.

Bismuth oxide can also influence a dielectric response of a ceramic material comprising PZT and bismuth oxide. Specifically, slightly higher dielectric constant and lower loss factors are obtained with materials comprising bismuth oxide relative to materials that do not comprise bismuth oxide.

It is noted that the above-discussed ceramic materials comprising bismuth oxide remain as a single perovskite phase, as confirmed using x-ray diffraction.

Sintering temperature can influence dielectric responses in PLZT comprising one weight percent bismuth oxide. It is found that higher dielectric constants are generally obtained at lower sintering temperatures, while dielectric loss factors are relatively low. For example, a dielectric constant and loss factor are found to be 903 and 0.026, respectively, for a material sintered at 900° C. for six hours. In addition, electrical resistivity of the material is found to be about $3 \times 10^{11}$ ohms-cm. Such properties are actually better than those of PLZT without additives for applications in which the PLZT is utilized as a dielectric material.

Ferroelectric properties of PLZT comprising one weight percent bismuth oxide indicate that polarization switching cannot be fully achieved for ceramics sintered below 900° C. The polarization becomes more easily switched with increasing sintering temperature. If the material is sintered at 1150° C., complete polarization switching can be accomplished. However, the remnant polarization is 20 $\mu$C/cm$^2$, which is a little lower than that of pure PLZT. This may result from the smaller grain size of the ceramic material that results when bismuth oxide is included, relative to the grain size when bismuth oxide is not included. An average grain size of PLZT comprising bismuth oxide is determined to be about 900 nanometers when the material is sintered at 1100° C., and about 200 nanometers when the material is sintered at 800° C. Such grain size is smaller than that which would be obtained when sintering PLZT lacking bismuth oxide under conventional conditions. In a preferred composition of PZT, or PLZT, the material will have a predominate portion with a maximum grain size of less than 500 nanometers after densification, and in particular preferred compositions, a maximum grain size throughout the composition will be less than 500 nanometers. In other compositions, the PZT or PLZT material will have a predominate portion with a maximum grain size of less than 200 nanometers after densification, and in yet other compositions, the PZT or PLZT material will have a predominate portion with a maximum grain size of less than 150 nanometers after densification.

In light of the above-discussed grain sizes determined for PZT (which includes PLZT) compositions comprising bismuth and formed with nanophase powders, it can be preferred that densification comprise a sintering temperature of less than about 1100° C., and more preferred that the densification comprise a sintering temperature of less than about 850° C.

Although the above-described methodologies for densifying materials comprised sintering, it is to be understood that materials of the present invention can also be densified by hot pressing or sinter-forging.

Regardless of the densification procedure utilized, the materials resulting from the densification can comprise, for example, a general formula Pb(Zr$_{(1-x)}$Ti$_x$)O$_3$, wherein x is from 0 to 1. Alternatively, if lanthanum is included to form PLZT, the compositions can comprise, for example, (Pb$_{(1-3y/2)}$La$_y$)(Zr, Ti)O$_3$, wherein y is from 0.01 to 0.5, and preferably from 0.02 to 0.30. If cationic forms of at least one element selected from the group consisting of potassium, sodium, cesium, calcium, strontium, barium, yttrium or lanthanide elements are included to substitute for some of the lead in the resulting PZT mixture, at least some of the mixture can be in the form of (Pb, M)(Zr$_{(1-x)}$Ti$_x$)O$_3$, wherein x is from 0 to 1 and "M" represents the cationic form of the at least one element. Further, if a second cation is provided comprising a cationic form of at least one element selected from the group consisting of iron, chromium, hafnium, tin, manganese, niobium, tantalum or tungsten to substitute for at least some of the titanium or zirconium, at least some of the material in the mixture can have the form $(Pb, M)(Zr_{(1-x-z)}Ti_xB_z)O_3$, with (x+z) being from 0 to 1, "B" being one of the cations, and "M" being another of the cations.

It is found that inclusion of nanophase powders and bismuth oxide in mixtures of the present invention not only result in lowered sintering temperatures for PZT with tetragonal structures (i.e., PZT compositions with high relative amounts of Ti), but can also be utilized for rhombohedral and orthorhombic structured PZT compositions (i.e., compositions comprising a high zirconium/titanium ratio). For instance, the sintering behavior of lead zirconate evidences that a fully dense structure is obtained after sintering at 1050° C. for two hours. Polarization measurements of such structure indicate that the structure is antiferroelectric, with a dielectric constant and loss factor of 166 and 0.002, respectively. It is found, however, that sintering at the lower temperature does not result in a full density. This may be caused by the coarser grain sizes of a PZO precursor powder in comparison with those for PZT. In fact, less than 80% of the theoretical maximum density is obtained after sintering at 1050° C. using micron-sized lead zirconate powders. Such could indicate that nanometer size powders are playing a significant role in enhancing densification.

Although the above-described ceramic composition were formed by providing bismuth oxide into a mixture comprising lead, zirconium and titanium, methods of the present invention can be utilized with other additives. For instance, in another embodiment of the invention, antimony oxide ($Sb_2O_5$) and/or vanadium oxide ($V_2O_5$) is combined with materials comprising lead, zirconium and titanium to form a ceramic material. Preferably, at least some of the combined components are provided as nanophase powders. It is found, however, that neither antimony oxide nor vanadium oxide works as well as bismuth oxide for lowering a sintering temperature of a PZT material.

Figure 2:
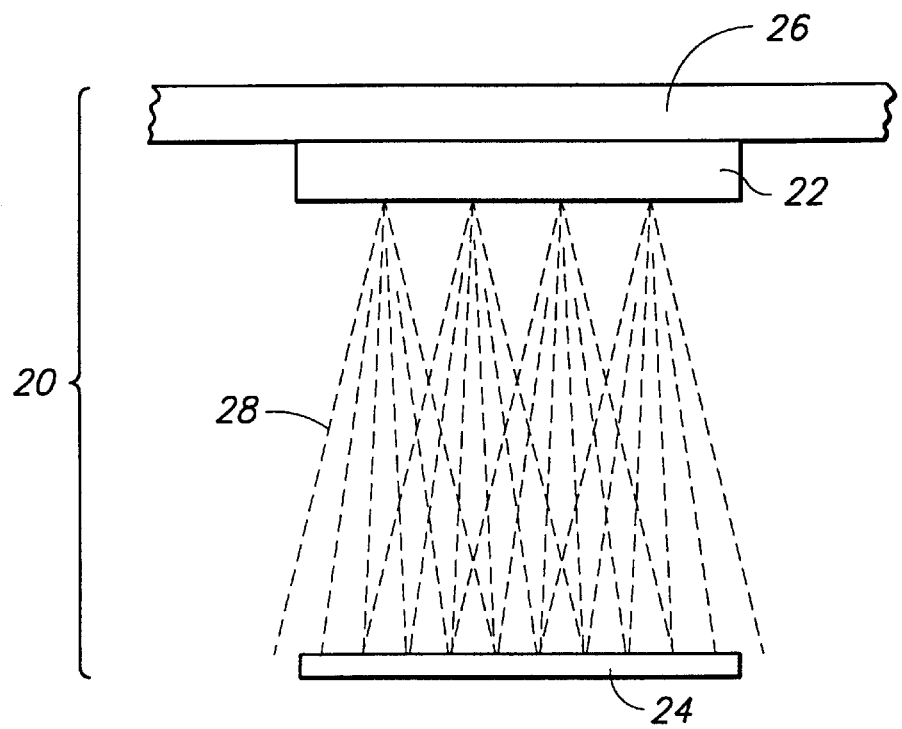
FIG. 2 is a view of a physical vapor deposition apparatus encompassed by the present invention.

Compositions of the present invention can be utilized in numerous applications in conventional PZT materials are being used. One such s application is as a sputtering target for formation of micro-electronic devices. FIG. 2 illustrates an apparatus 20 utilizing a physical vapor deposition target 22 encompassing compositions of the present invention. Apparatus 20 has a semiconductive material wafer 24 therein and spaced from target 22, and a backing plate 26 retaining target 22 in a proper orientation relative to wafer 24. Sputtered material 28 is shown being transferred from target 22 to wafer 24 to form a film of the sputtered material over a surface of the wafer.

Compositions of the present invention can be preferred relative to prior art PZT compositions for forming physical vapor deposition targets, such as, for example, sputtering targets, as the ceramic materials formed by the present invention can be dense, uniform throughout their composition, and can comprise small grain sizes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A physical vapor deposition target, comprising:
  a backing plate; and
  a ferroelectric ceramic composition joined to the backing plate, the composition comprising lead, zirconium, titanium and bismuth; a density of the composition being greater than or equal to 95% of a theoretical maximum density for the composition; a predominate portion of the composition having a grain size of less than or equal to about 500 nanometers.

2. The target of claim 1 wherein a maximum grain size of the composition is less than or equal to about 500 nanometers.

3. The target of claim 1 wherein a predominate portion of the composition has a grain size less than or equal to about 200 nanometers.

4. The target of claim 1 wherein a predominate portion of the composition has a grain size less than or equal to about 150 nanometers.

5. The target of claim 1 wherein a maximum grain size of the composition is less than or equal to about 150 nanometers.

6. The target of claim 1 wherein the composition comprises a density of at least 98% of the theoretical maximum density.

7. The target of claim 1 wherein the composition comprises a density of at least 99% of the theoretical maximum density.

* * * * *